United States Patent [19]

Bianchini et al.

[11] Patent Number: 5,150,080
[45] Date of Patent: Sep. 22, 1992

[54] FREQUENCY AGILE SWITCHED RESONATOR OSCILLATOR WITH NOISE DEGENERATION

[75] Inventors: Michael J. Bianchini, North Middleboro; Christopher T. Lyons, Tyngsboro; Richard A. Michalik, Andover; Raymond C. Waterman, Jr., Westford, all of Mass.

[73] Assignee: Raytheon Company, Lexington, Mass.

[21] Appl. No.: 806,956

[22] Filed: Dec. 12, 1991

[51] Int. Cl.$^5$ ............................ H03B 1/04; H03B 5/18
[52] U.S. Cl. ........................................ 331/99; 331/96; 331/117 D; 331/175; 331/179
[58] Field of Search ............ 331/96, 99, 100, 107 DP, 331/107 SL, 117 D, 175, 177 R, 179

[56] References Cited

U.S. PATENT DOCUMENTS

| | | | |
|---|---|---|---|
| 4,555,678 | 11/1985 | Galani et al. | 331/1 A |
| 4,692,714 | 9/1987 | Galani | 331/1 R |
| 4,758,800 | 7/1988 | DiBiase et al. | 331/1 R |
| 4,775,845 | 10/1988 | McCoy | 331/179 X |
| 5,032,800 | 7/1991 | Galani et al. | 331/1 R |

OTHER PUBLICATIONS

Dielectric Resonators: Past, Present and Future, Martin R. Stiglitz, Microwave Journal, Jul. 1991, pp. 1-20, 22, 26, 28, 30, 34-36.

Primary Examiner—David Mis
Attorney, Agent, or Firm—Donald F. Mofford; Richard M. Sharkansky

[57] ABSTRACT

An oscillator includes an amplifier having an input and an output and a feedback circuit disposed between the input and the output of the amplifier. The feedback circuit includes a plurality of resonators and a pair of switches. Each switch includes a first port and multiple connectable ports, the multiple connectable ports of each switch connected to a corresponding one of the plurality of resonators. The feedback circuit further includes a voltage-controlled phase shifter disposed in series with the switches. The oscillator further includes a discriminator circuit, responsive to signals from the feedback circuit, for providing a control signal to the voltage-controlled phase shifter for degenerating low frequency noise within the oscillator. With such an arrangement, high Q low noise resonators can be switched in and out of the circuit thus providing improved phase noise performance at high power levels with the desirable frequency agility required for a microwave oscillator.

11 Claims, 3 Drawing Sheets

FREQUENCY AGILE SWITCHED RESONATOR OSCILLATOR WITH NOISE DEGENERATION

BACKGROUND OF THE INVENTION

This invention pertains generally to microwave oscillators and in particular to a low noise microwave oscillator.

It is known in the art that microwave oscillators having low noise for low noise applications are necessary for many advanced electronics systems. In a microwave oscillator, frequency modulation (FM) noise is a problem due to the noise characteristics of the components in the oscillator. It is advantageous to reduce the FM noise characteristics of a microwave oscillator. One technique known for reducing noise in a microwave oscillator is described in U.S. Pat. No. 5,032,800, issued Jul. 16, 1991, entitled "Tunable Oscillator with Noise Degeneration," (which patent is assigned to the same assignee as this application). In said patent an oscillator is described including an amplifier having an input and an output and a feedback circuit disposed between the input and the output of the amplifier. The feedback circuit includes a yttrium-iron-garnet (YIG) filter and a voltage-controlled phase shifter disposed in series with the YIG filter. The oscillator further includes a discriminator circuit responsive to signals from the voltage-controlled phase shifter and the YIG filter, for providing a control signal to a control port of the voltage-controlled phase shifter for degenerating close-to carrier noise within the oscillator caused by up-converted low frequency noise arising in the amplifier. With this particular arrangement, using a control port of the voltage-controlled phase shifter as the tuning port of the oscillator provides an oscillator having predictable oscillator modulation sensitivity from oscillator to oscillator and a modulation sensitivity which is independent of the signal level in the oscillator feedback loop until very high signal levels are reached. Additionally, a frequency tuning capability is provided for oscillators using one port amplifier devices such as Gunn diode amplifiers and IMPATT diode amplifiers.

An alternative technique for reducing noise when using a gallium arsenide FET as an active element is a single resonator microwave oscillator as described in U.S. Pat. No. 4,555,678, issued Nov. 26, 1985, entitled "Microwave Oscillator" (which patent is assigned to the same assignee as this application). In that patent, it is described that a gate bias port of a FET amplifier can be used as the tuning port of the oscillator since the gate to source capacitance of the FET is dependent on gate to source voltage. Thus a signal applied between the gate and source terminals changes the value of the gate to source capacitance which in turn modulates the phase of the signal amplified by the FET. The dispersive phase response of the resonator in the feedback circuit converts the phase modulation of the amplified signal to a frequency modulated signal at the output of the oscillator. Thus the frequency of the oscillator is modulated by the signal applied to the gate bias port serving as the tuning port of the oscillator.

Although each of the above described techniques are useful in many applications, microwave oscillators often require frequency agility and low FM noise but at a higher power level and with less cost. For example, in an application wherein the oscillator is operating at high power near the saturation limit of a resonator including a YIG filter, the FM noise level of the oscillator is increased severely. Also, FM noise can be induced by eddy currents within the YIG filter, particularly in the RF structure. Although FM noise can be reduced by a technique as described in U.S. Pat. No. 4,758,800, issued Jul. 19, 1988, entitled "Low Noise Magnetically Tuned Resonant Circuit" (which patent is assigned to the same assignee as this application), such a technique adds to the complexity of the circuitry.

SUMMARY OF THE INVENTION

With the foregoing background of the invention in mind, it is a primary object of this invention to provide a microwave oscillator with low FM noise at lower cost.

Another object of this invention is to provide a microwave oscillator with low FM noise and frequency agility.

Still another object of this invention is to provide a microwave oscillator with low FM noise at higher power levels than that associated with a YIG resonator.

The foregoing and other objects of this invention are met generally by an oscillator including an amplifier having an input and an output and a feedback circuit disposed between the input and the output of the amplifier. The feedback circuit includes a plurality of resonators and a pair of switches. Each switch includes a first port and multiple connectable ports, the multiple connectable ports of each switch connected to a corresponding one of the plurality of resonators. The feedback circuit further includes a voltage-controlled phase shifter disposed i series with the switches. The oscillator further includes a discriminator circuit, responsive to signals from the feedback circuit, for providing a control signal to the voltage-controlled phase shifter for degenerating low frequency noise within the oscillator. With such an arrangement, high Q low noise resonators can be switched in and out of the circuit thus providing improved phase noise performance at high power levels with the desirable frequency agility required for a microwave oscillator.

In accordance with a further aspect of the present invention, a microwave oscillator having an output signal with different selectable output frequencies includes an amplifier and a pair of switches, each switch having a first port and multiple connectable ports. The microwave oscillator further includes a plurality of resonators, each resonator resonant at a corresponding one of the different output frequencies and connected between a corresponding one of the multiple connectable ports of the pair of switches, each resonator having a high Q to reduce FM noise and to provide for positive feedback signals. The microwave oscillator still further includes a voltage-controlled phase shifter having an input port and output port and a control port, the input port fed by a first port of one of the switches and the output port coupled to an input of the amplifier. The microwave oscillator still further includes a phase detector, responsive to signals out of the amplifier shifted by 90° and a portion of the positive feedback signals, for providing signals representative of low frequency noise arising within the oscillator and a noise degeneration circuit, responsive to the signals out of the phase detector, for providing a control signal to the control port of the voltage-controlled phase shifter for degenerating the low frequency noise. With such an arrangement, a microwave oscillator is provided which achieves lower noise performance at higher power levels for multiple frequencies and with less complexity than that associated with a YIG filter.

BRIEF DESCRIPTION OF THE DRAWINGS

For a more complete understanding of this invention reference is now made to the following description of the accompanying drawings wherein.

DESCRIPTION OF THE PREFERRED EMBODIMENT

Figure 1:
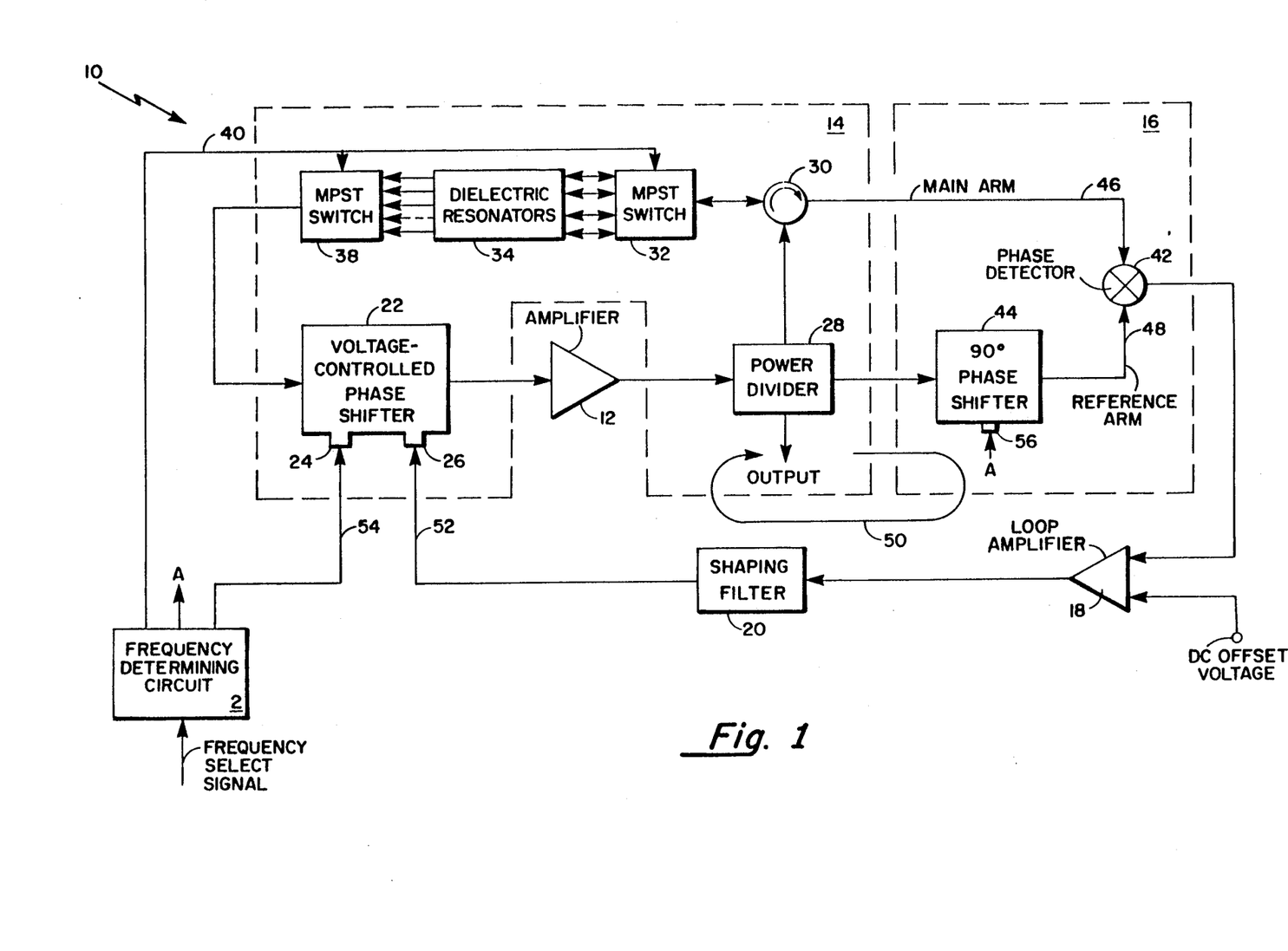
FIG. 1 is a block diagram of a low noise oscillator according to this invention.

Referring now to FIG. 1, an oscillator 10 is shown to include an amplifier 12 having an input and an output and a feedback circuit 14 disposed about the amplifier 12. The amplifier 12 preferably includes a gallium arsenide MESFET as the active element thereof but could also be of another type of amplifier. The feedback circuit 14 includes a voltage-controlled phase shifter 22 having an input port and an output port. The output of the voltage-controlled phase shifter is fed to the input of the amplifier 12. The voltage-controlled phase shifter 22 also includes a control port 24 fed by a course control signal along line 54 in a manner as will be described and a control port 26 fed by a control signal along line 52 which adjusts the phase of a signal propagating through the feedback circuit 14 in a manner as will be described. The output of the amplifier 12 is connected to an input of a power divider 28. The power divider 28 includes a first, a second and a third output port wherein the first output port is coupled to a first port of a circulator 30 and the third output port is used to provide the output from the oscillator 10. The second output port of the power divider 28 is fed to a discriminator circuit 16 in a manner as described hereinafter. The circulator 30 also includes a second port and a third port wherein the second port is fed to a multiple pole single throw switch 32 and the third port is fed to the discriminator circuit 16. The multiple pole single throw switch 32 includes a plurality of selectable output ports wherein each one of the output ports is connected to a corresponding one of a plurality of dielectric resonators 34. Completing the feedback circuit 14 is a multiple pole single throw switch 38 having a plurality of input ports and a single output port. Each one of the input ports of the multiple pole single throw switch 38 is connected to a corresponding one of the plurality of dielectric resonators 34. The output port of the switch 38 is connected to the input of the voltage-controlled phase shifter 22.

The plurality of resonators 34 are each dielectric resonators and resonant at a corresponding resonant frequency. Each one of the dielectric resonators 34 has a high Q to reduce FM noise and to stabilize the phase and frequency characteristics of the oscillator 10 and, when selected, provide a positive feedback signal in feedback circuit 14. A signal from the output port of the multiple pole single throw switch 38 is fed to the input port of the voltage-controlled phase shifter 22. The voltage-controlled phase shifter 22 is capable of coupling the signal from the input port to the output port of the voltage-controlled phase shifter 22 while imparting a selectable differential phase shift to said signal, the amount of which is selected by the control signals applied to the control ports 24 and 26. A signal at the output port of the voltage-controlled phase shifter 22 is fed to the amplifier 12 wherein such signals are amplified and fed to the output of the amplifier 12. A portion of the signal at the output of the amplifier 12 is fed, via the power divider 28 and the circulator 30, to the input port of the multiple pole single throw switch 32 which couples said signal to the selected one of the dielectric resonators 34. The conditions for commencement of oscillation of oscillator 10 at a selected frequency are satisfied if the gain of the amplifier 12 exceeds the total loss of the feedback circuit 14 and the total phase shift through the feedback circuit 14 and the amplifier 12 is an integral multiple of two x radians at the selected frequency.

The oscillator 10 further includes the discriminator circuit 16 which is fed by a pair of signals with one of said signals being from the third port of the circulator 30 being fed along a branch referred to in FIG. 1 as the main arm directed to an input of a phase detector 42. The second signal from the power divider 28 is fed to a 90° phase shifter 44 (here a voltage-controlled phase shifter) and exiting the 90° phase shifter 44 along a branch referred to as the reference arm to a second input of the phase detector 42. The output of the phase detector 42 is fed to a loop amplifier 18 and a shaping filter 20, here a low pass filter, to provide the control signal along the line 52 to the voltage-controlled phase shifter 22.

In operation, the signal applied to the selected one of the dielectric resonators 34, here via the multiple pole single throw switch 32, from the circulator 30 is critically coupled. Critical coupling provides a transfer function of the discriminator 16 in the form of a conventional S-shaped discriminator curve. When the resonant frequency of the selected resonator is changed, the crossover point of the S curve changes concurrently. The slope of such discriminator curve is controlled by the degree of coupling at the input port of the selected dielectric resonator and, with critical coupling, is directly proportional to the loaded Q of the selected resonator. Critical coupling may be accomplished with each one of the dielectric resonators 34 by adjusting the distance between the dielectric disc (not shown) of each one of the dielectric resonators 34 from the corresponding microstrip input line to provide a reflection null at the selected frequency from the input port of the selected resonator.

A signal reflected from the selected one of the dielectric resonators 34 is fed, via the circulator 30 and the main arm 46, to the first input port of the phase detector 42. A signal traveling from the second output port of power divider 28 is applied, via the 90° phase shifter 44 and the reference arm 48, to the second input port of the phase detector 42 providing a reference signal for the phase detector 42. The 90° phase shifter 44 provides a quadrature phase relationship between the reference signal and the signal reflected from the selected one of the dielectric resonators 32 at the first and second input ports of the phase detector 42. The 90° phase shifter 44 is a voltage-controlled phase shifter with a control port 56. The control port 56 is tuned in unison with the selected one of the dielectric resonators 34 to maintain a quadrature phase relationship between the signals at the input port of the phase detector 42. When tuning the selected one of the dielectric resonators 34, the path lengths in the main arm 46 and the reference arm 48 change relative to each other if not perfectly time delay balanced. In this case the voltage-controlled phase shifter 44 may be used to eliminate the delay difference and to maintain a 90° phase difference between the signals at the input ports of phase detector 42. An output signal from the phase detector 42 provides a signal relative to the amount of FM noise in the oscillator 10. The signal from the output of the phase detector 42, which is also the output of the discriminator 16, is applied to a loop amplifier 18 where said signal is amplified. The signal from the loop amplifier 18 is fed to the shaping filter 20 where such signal is filtered and fed to the control port 26 of the voltage-controlled phase shifter 22. A DC offset voltage may be summed into a second input port of the loop amplifier 18 in order to satisfy the biasing requirements of the voltage-controlled phase shifter 22.

It should be appreciated, a noise degeneration loop 50 comprising the power divider 28, the discriminator 16, the loop amplifier 18, the shaping filter 20 and the voltage-controlled phase shifter 22 is provided to degenerate FM noise in the oscillator 10 to the level of the discriminator's noise floor. The noise degeneration loop 50 is a frequency locked loop (FLL) which ensures the frequency of the signal out of the voltage-controlled phase shifter 22 to be nominally locked to the center frequency of the passband (which is equal, nominally, to the discriminator's S-curve cross-over frequency) of the selected one of the dielectric resonators 34, when the voltage-controlled phase shifter 24 is properly biased by the control signal fed to the control port 26 as a feedback signal. An undesired change of frequency in the feedback circuit 14 will result in a change in the output signal from the discriminator 16. The latter will result in a change in the control signal fed to the control port 26 of the voltage-controlled phase shifter 22 thus minimizing changes in the selected frequency of the oscillator 10.

The oscillator 10 also includes a frequency determining circuit 2 which in response to a frequency select signal from a controller (not shown) provides a control signal along line 40 to the multiple pole single throw switch 38 and the multiple pole single throw switch 32 to select a proper input port and a proper output port, respectively. The latter selects the proper one of the dielectric resonators 34 correlating to the frequency select signal fed to the frequency determining circuit 2. The frequency determining circuit 2 also provides a control signal along line 54 to coarse control port 24 of the voltage-controlled phase shifter 22. Such a control signal is used to bias the coarse control port 24 of the voltage-controlled phase shifter 22 to provide a proper phase shift to ensure oscillation at the selected frequency correlating to the frequency select signal fed to frequency determining circuit 2. It should be appreciated when the frequency of the feedback circuit 14 is changed by changing the selected one of the dielectric resonators 34, the frequency of the cross-over of the S-curve changes and the oscillator 10 is locked to the new frequency by noise degeneration loop 50. The frequency determining circuit 2 also provides a control signal to control port 56 of the 90° phase shifter 44 to ensure that a 90° phase difference between the input signals at the input ports of the phase detector 42 is maintained at the selected frequency.

It should now be appreciated, the microwave oscillator 10 provides output signals with each signal having a different discrete frequency corresponding to the resonant frequency of each one of the dielectric resonators 34. The low noise and small size of the oscillator and use of low cost dielectric resonators make the oscillator particularly useful for missile applications wherein noise generated at base band frequencies which is upconverted to the offset frequencies at the order of expected doppler frequency shifts will reduce the subclutter visibility of the missile radar. Thus, reducing the noise will increase the subclutter visibility of the missile radar.

Figure 2:
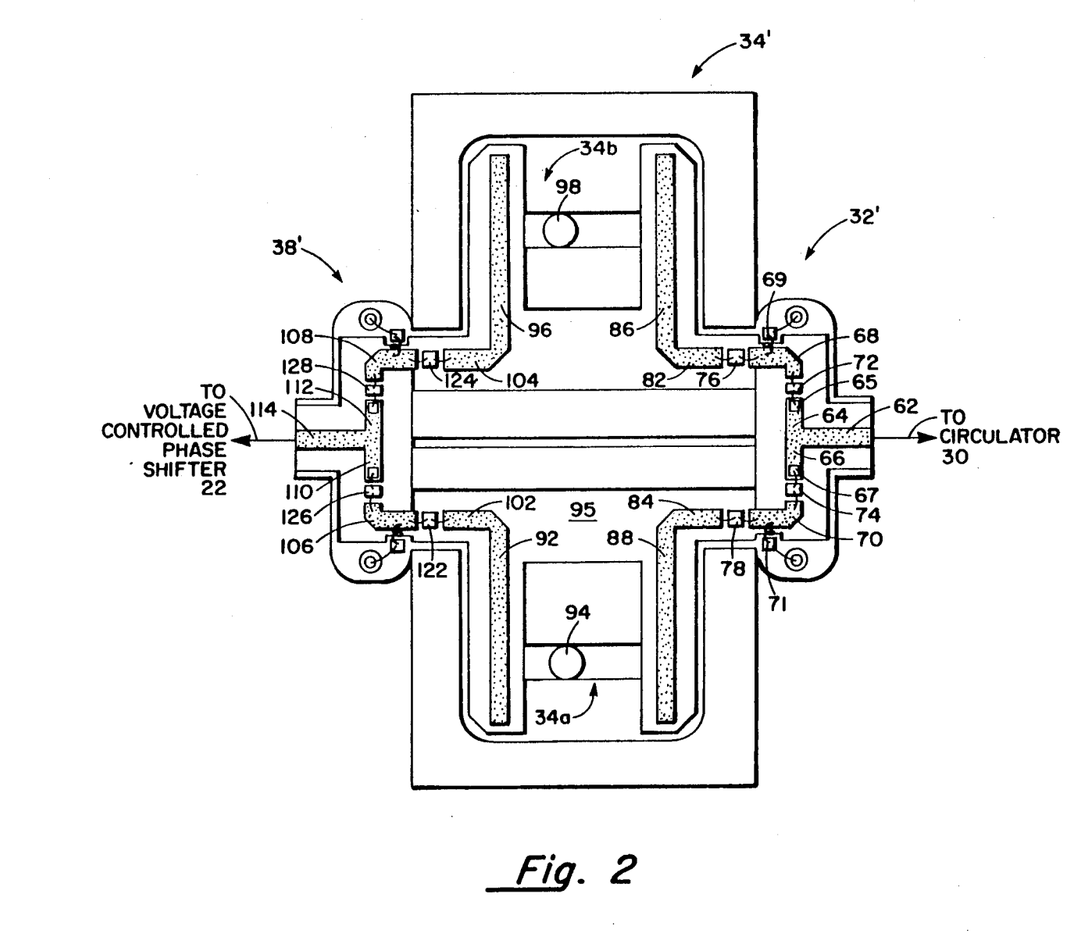
FIG. 2 is a plan view of a pair of dielectric resonators and a pair of double pole single throw switches used in the invention.

Referring now to FIG. 2, a plan view of a microstrip implementation of a switch 32' and 38', here each one of the switches 32' and 38' having two poles, and dielectric resonators 34', here including resonators 34a and 34b. It should be appreciated that switch 32', switch 38' and dielectric resonator 34' is a two resonator implementation for the oscillator 10 (FIG. 1) with the above elements corresponding to multiple pole single throw switch 32, multiple pole single throw switch 38 and dielectric resonators 34, respectively of FIG. 1. A strip conductor 62, which is connected to the circulator 30 (FIG. 1) provides an input to the switch 32, The strip conductor 62 is branched into two conductors, conductor 64 and conductor 66 and terminated. A PIN diode 72, having a cathode (not shown) and an anode, the cathode connected to a ground plane (not shown) is disposed adjacent the conductor 64. A strip conductor portion 68 is disposed, as shown, adjacent the PIN diode 72. Bond wires (not numbered) are used to connect the anode of PIN diode 72 to the conductor 64 and the strip conductor portion 68. A PIN diode 76, having a cathode (not shown) and an anode, the cathode connected to the ground plane (not shown) is disposed adjacent the strip conductor portion 68. A strip conductor 82 is disposed, as shown, adjacent the PIN diode 76 and connected to a feed line 86 of the dielectric resonator 34b. Bond wires (not numbered) are used to connect the anode of the PIN diode 76 to the strip conductor portion 68 and the strip conductor 82. A PIN diode 74, having a cathode (not shown) and an anode, the cathode connected to a ground plane (not shown), is disposed adjacent the conductor 66. A strip conductor portion 70 is disposed, as shown, adjacent the PIN diode 74. Bond wires (not numbered) are used to connect the anode of the PIN diode 74 to the conductor 66 and the strip conductor portion 70. A PIN diode 78, having a cathode (not shown) and an anode, the cathode connected to the ground plane (not shown) is disposed adjacent the strip conductor portion 70 as shown. A strip conductor 84 is disposed adjacent the PIN diode 78 and connected to a feed line 88 of the dielectric resonator 34a. The PIN diodes 72, 74, 76 and 78 are here diodes manufactured by M/A Com, Inc. located in Burlington, Massachusetts having a part No. 3927-PP69706. Preferably each of the PIN diodes have the following characteristics as shown in TABLE I.

TABLE I

| | |
|---|---|
| $C_{JO}$ (pf) Junction Capacitance $V_R = 0$ v. F = 6 GHz | .10– .14 |
| Parallel Resistance $R_p$ VR = 0 V FREQ = 18 GHz | 714 ohms Minimum |
| $C_J$ (pf) Change in Junction Capacitance (Max) ($V_R = 0$ to $V_R = -1$ V) F = 6 GHz | .015 |
| $R_S$ (Ω) | 3 Ω |

TABLE I-continued

| | |
|---|---|
| Series Resistance (Max) | at |
| F = 6 GHz | 5 ma |
| $T_T$ (ns) | 25 MAX. |
| Transition Time | |
| $V_B$ (Volts) | 75 MIN. |
| Breakdown Voltage | |
| $I_R$ = 10 μA | |
| Minority Carrier | 40 MIN. |
| Lifetime (nanoseconds) | 100 MAX. |
| $T_L$ | |

It should be appreciated, when PIN diodes 72, 74, 76, and 78 are biased in the "off" condition, then a signal propagating on the strip conductor 62 will propagate along conductor 64, along the bond wires to strip conductor portion 68, along the bond wires and appear on strip conductor 82. The signal propagating along strip conductor 62 will also propagate along conductor 66, along the bond wires to strip conductor portion 70, along the bond wires and appear on strip conductor 84. However, if PIN diode 72 and PIN diode 76 are biased in the "on" condition and PIN diode 74 and PIN diode 78 are biased in the "off" condition, then a signal appearing at conductor 64 will encounter a short to ground thus preventing the signal from reaching strip conductor portion 68 while a signal propagating along strip conductor 62 will be coupled to strip conductor 84. Any residual signal at strip conductor portion 68 will encounter a short to ground at PIN diode 76 preventing the residual signal from reaching the strip conductor 82. In the alternative, if PIN diode 74 and PIN diode 78 are biased in the "on" condition and PIN diode 72 and PIN diode 76 are biased in the "off" condition, then a signal appearing at conductor 66 will see a short to ground preventing the signal from propagating to strip conductor portion 70 while a signal at strip conductor 62 will be coupled to strip conductor 82. Any residual signal a strip conductor portion 70 will encounter a short to ground at PIN diode 78 preventing the residual signal from reaching the strip conductor 84. Thus, by biasing either PIN diode 72 and 76 in the "on" condition and 74 and 78 in the "off" condition or, alternatively, biasing PIN diode 74 and 78 in the "on" condition and 72 and 76 in the "off" condition, a signal appearing at strip conductor 62 can be coupled to either dielectric resonator 34a or dielectric resonator 34b, respectively.

The dielectric resonator 34a includes the feed line 88 and a branch line 92 and a dielectric disc 94. The dielectric disc 94 is fabricated from a material having here a relative dielectric constant of 25 providing a high Q of at least 20,000 at 10 GHz with a diameter of 0.1992±0.002 inches and a height of 0.088±0.002 inches. Such a dielectric disc 94 can be provided by Murata Erie North American, Inc. located in State College, Pa. as part No. DRD051E022. The branch line 92 is disposed parallel with the feed line 88 as shown with the dielectric disc 94 disposed in between. The dielectric disc 94 is attached to a dielectric standoff (not shown) disposed underneath the dielectric PIN 94 by any known means such as epoxying. The dielectric standoff, in turn, is epoxied to a ground plane. To achieve critical coupling at the desired frequency, the dielectric disc 94 is disposed at the appropriate relative distance between the feed line 88 and the branch line 92. The dielectric disc 94 is held in place to the dielectric standoff by epoxy which is in its cured state. The dielectric standoff is held to the ground plane by epoxy in its cohesive state. The dielectric resonator 34a can be measured to ensure that critical coupling has been achieved at the proper frequency and if necessary the dielectric disc 94 and the dielectric standoff can be adjusted together to ensure the latter during construction. The epoxy is then cured to prevent further movement of the dielectric standoff. Here, by providing a slot orthogonal to the feedline 88 and the branchline 92 to form a track to place the dielectric standoff, the lateral position of the dielectric disc 94 relative to the feedline 88 and the branch line 92 is controlled and the juxtapositional position is adjusted accordingly. It should be appreciated if the switch 32' and the dielectric resonators 34, are constructed on a common dielectric substrate as a single assembly and a measurement is taken at strip conductor 62 when adjusting the dielectric disc 94, the effects of the circuit elements of the switch 32, can be corrected for.

The dielectric resonator 34b is similar to the dielectric resonator 34a but having a different operating frequency. A branch line 96 is disposed parallel to a feed line 86 with a dielectric disc 98 disposed in between. The dielectric disc 98 is fabricated similar to the dielectric disc 94 but having a different operating frequency corresponding to the operating frequency of the dielectric resonator 34b. Critical coupling is achieved in a like manner as described with dielectric resonator 32a.

The switch 38' is fabricated similar to the switch 32' with the switch 38' having a strip conductor 102 connected to the branch line 92. The switch 38' further includes PIN diodes 122, 124, 126, and 128, each having a cathode (not shown) and an anode, the cathode of each PIN diode 122, 124, 126, and 128 connected to the ground plane (not shown). The PIN diodes 122, 124, 126 and 128 are here also diodes manufactured by M/A Com, Inc. located in Burlington, Mass. having a part No. 3927-PP69706. The PIN diode 122 is disposed adjacent the strip conductor 102. A strip conductor portion 106 is disposed adjacent the PIN diode 122 as shown. Bond wires (not numbered) connect the anode of the PIN diode 122 to the strip conductor 102 and the strip conductor portion 106. The PIN diode 126 is disposed, as shown, adjacent the strip conductor portion 106. A strip conductor 114 provides an output to the switch 38' and is branched into two conductors, conductor 110 and conductor 112 with the conductor 110 disposed adjacent the PIN diode 126. Bond wires (not numbered) connect the anode of PIN diode 126 to the strip conductor portion 106 and the conductor 110. Similarly, strip conductor 104 is connected to the branch line 96 of the dielectric resonator 34b. The PIN diode 124 is disposed adjacent the strip conductor 104 and a strip conductor portion 108 is disposed adjacent the PIN diode 124 as shown. Bond wires (not numbered) connect the anode of PIN diode 124 to the strip conductor 104 and the strip conductor portion 108. The PIN diode 128 is disposed between the strip conductor portion 108 and the conductor 112 as shown. Bond wires (not numbered) connect the anode of PIN diode 128 to the strip conductor portion 108 and the conductor 112. By biasing the PIN diodes 122 and 126 in the "off" condition and the PIN diodes 124 and 128 in the "on" condition, a signal from the dielectric resonator 34a is coupled to the strip conductor 114. Alternatively, by biasing the PIN diodes 122 and 126 in the "on" condition and PIN diodes 124 and 128 in the "off" condition, a signal from the dielectric resonator 34b is coupled to the strip conductor 114.

With such an arrangement, switches 32' and 38' can select either dielectric resonator 34a or 34b.

Referring now also to FIG. 1, it should be appreciated biasing circuitry (not shown) controls the biasing of PIN diodes 72, 74, 76 and 78 of switch 32' and also control the biasing of PIN diodes 122, 124, 126, and 128 of switch 38'. The frequency determining circuit 12 provides a control signal to the biasing circuitry (not shown) to bias the PIN diodes accordingly. A first direct current (DC) biasing signal from the biasing circuitry (not shown) is fed through an inductor 69 to the strip conductor portion 68 and a DC blocking capacitor 65 isolates the first DC biasing signal from the conductor 64. A second DC biasing signal from the biasing circuitry (not shown) is fed through a conductor 71 to the strip conductor portion 70 and a DC blocking capacitor 67 isolates the second DC biasing signal from the conductor 66. A similar arrangement provides DC biasing signals to the circuit 38'. With such an arrangement, the microwave oscillator 10 can be selected to one of two operating frequencies.

Figure 3:
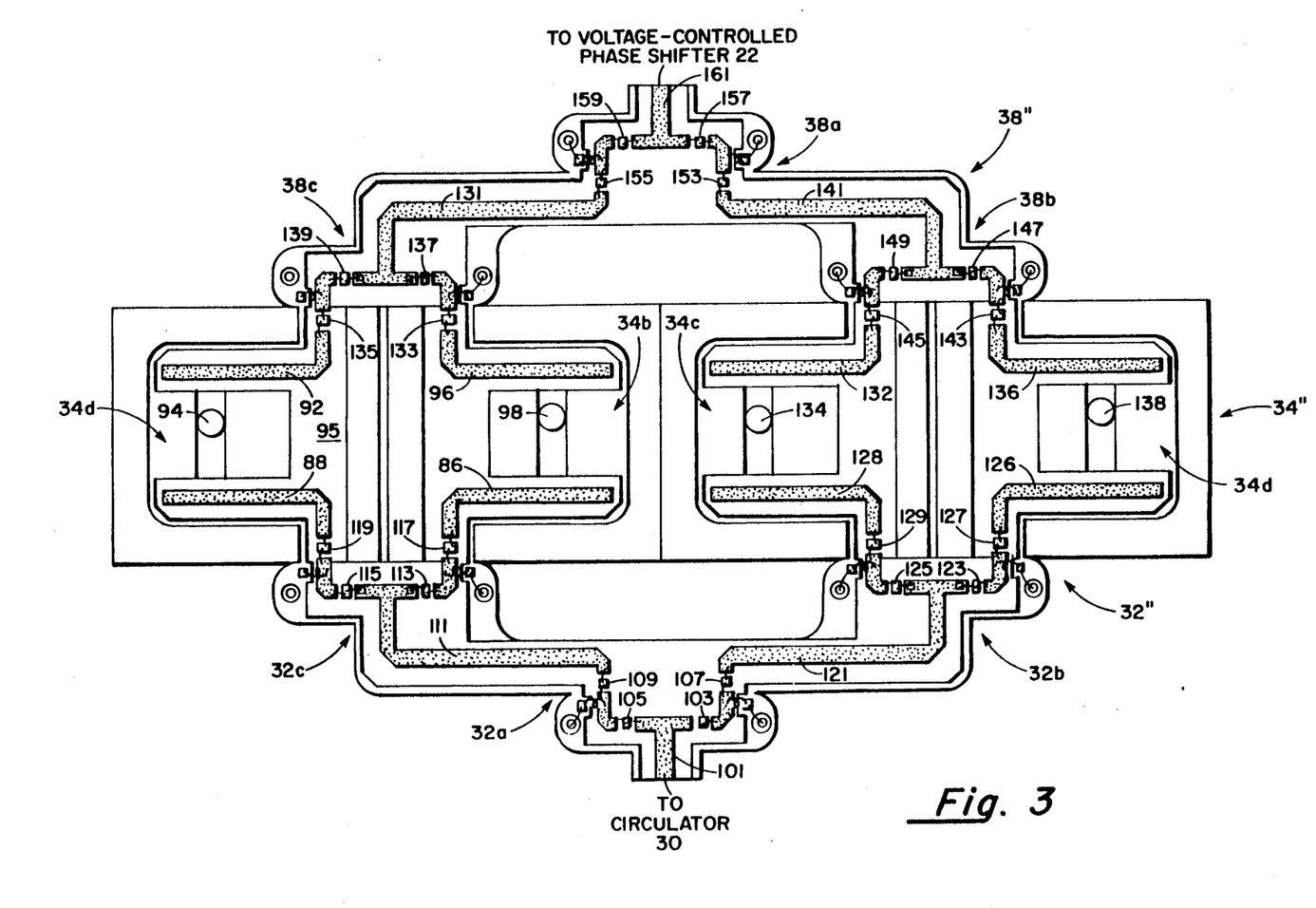
FIG. 3 is a plan view of four dielectric resonators and a pair of four pole single throw switches used in the invention.

Referring now to FIG. 3, a plan view of a microstrip implementation of a switch 32" and 38", here each one of the switches 32" and 38" having four poles, and dielectric resonators 34", here including resonators 32a, 32b, 32c and 32d. It should be appreciated that the microstrip implementation with switch 32", 38" and dielectric resonators 34" is a four resonator implementation for the oscillator 10 (FIG. 1) with the above elements corresponding to multiple pole, single throw switch 32, multiple pole, single throw switch 38 and dielectric resonators 34, respectively. A strip conductor 101, which is connected to the circulator 30 (FIG. 1), provides an input to the switch 32". The switch 32" includes a switch arrangement 32a, a switch arrangement 32b and a switch arrangement 32c. The switch arrangement 32a includes a PIN diode 103, a PIN diode 105, a PIN diode 107, and a PIN diode 109 disposed as shown. The switch assembly 32b includes a PIN diode 123, a PIN diode 125, a PIN diode 127, and a PIN diode 129 disposed as shown. Similarly, the switch assembly 32c includes a PIN diode 113, a PIN diode 115, a PIN diode 117 and a PIN diode 119 disposed as shown. Each one of the switch assemblies 32a, 32b and 32c include an input and a first and a second output and operate in a manner similar to that as described with switch 32' of FIG. 2. The first output of switch assembly 32a is connected, via strip conductor 111, to the input of switch assembly 32c. The second output of switch assembly 32a is connected, via strip conductor 121, to the input of switch assembly 32b. The first output of switch assembly 32c is connected to a feed line 88 of the dielectric resonator 34a. The second output of switch assembly 32c is connected to a feed line 86 of the dielectric resonator 34b. The first output of switch assembly 32b is connected to a feed line 128 of the dielectric resonator 34c. The second output of switch assembly 32b is connected to a feed line 126 of the dielectric resonator 34d. Remembering that each one of the switch assemblies 32a, 32b and 32c operate in a manner similar to that described with switch 32' (FIG. 2), a signal applied to strip conductor 101 is coupled to the feed line 88 of dielectric resonator 32a when PIN diodes 105, 109, 115 and 119 are biased in the "off" condition and PIN didoes 103, 107, 113, 117, 123, 125, 127 and 129 are biased in the "on" condition. To couple a signal from strip conductor 101 to the dielectric resonator 34b the PIN diodes 105, 109, 113 and 117 are biased in the "off"
condition and all other diodes of switch 32" are biased in the "on" condition. Furthermore, to couple a signal from strip conductor 101 to the dielectric resonator 34c, PIN diodes 103, 107, 125, and 129 are biased in the "off" condition and all other PIN diodes of switch 32" are biased in the "on" condition. Finally, to couple a signal at the strip conductor 101 to dielectric resonator 34d, the PIN didoes 103, 107, 123, and 127 are biased in the "off" condition and PIN diodes 105, 109, 113, 115, 117, 119, 125, and 129 are biased in the "on" condition. With such an arrangement, a signal at strip conductor 101 can be coupled, selectively, to dielectric resonator 34a, 34b, 34c and 34d.

The dielectric resonators 34" are constructed in manner similar to dielectric resonators 34' of FIG. 2. Thus, dielectric resonator 34a includes the feed line 88 disposed in parallel with a branch line 92 as shown with a dielectric disc 94 disposed in between. The dielectric resonator 34b includes the feed line 86 disposed in parallel with a branch line 96 as shown with a dielectric disc 98 disposed in between. Furthermore, the dielectric resonator 34c includes the feed line 128 disposed in parallel with a branch line 132 as shown with a dielectric disc 134 disposed in between. Finally, the dielectric resonator 34d includes the feed line 126 disposed in parallel with a branch line 136 as shown with a dielectric disc 138 disposed in between. Each one of the dielectric resonators 34" are similar to another but with each one having a different operating frequency. With the switch 32", the dielectric resonators 34" and the switch 38" fabricated on a common substrate as a single assembly, if a measurement is taken at the strip conductor 101 when adjusting each one of the dielectric discs 94, 98, 134 and 138, respectively, the effects of the circuit elements of the switch can be corrected for.

The switch 38" includes a switch assembly 38a, a switch assembly 38b and a switch assembly 38c. The switch assembly 38a includes PIN diodes 153, 155, 157, and 159 disposed as shown. The switch assembly 38b includes PIN diodes 143, 145, 147, and 149 disposed as shown. The switch assembly 38c includes PIN didoes 133, 135, 137, and 139 disposed as shown. Each one of the switch assemblies 38a, 38b, and 38c includes a first and a second input and an output. The first input of switch assembly 38c is connected to the branch line 92 of the dielectric resonator 34a and the second input of the switch assembly 38c is connected to the branch line 96 of dielectric resonator 34b. The output of the switch assembly 38c is connected, via a strip conductor 131, to the first input of the switch assembly 38a. The first input of switch assembly 38b is connected to the branch line 132 of dielectric resonator 34c and the second input of the switch assembly 38b is connected to the branch line 136 of the dielectric resonator 34d. The output of dielectric resonator 38b is connected, via a strip conductor 141, to the second input of switch assembly 38a. The output of switch assembly 38a is connected to a strip conductor 161 which is connected to the voltage-controlled phase shifter 22 (FIG. 1). With such an arrangement, by biasing the PIN diodes 135, 139, 155 and 159 in the "off" condition and PIN diodes 133, 137, 143, 145, 147, 149, 153, and 157 in the "on" condition, a signal at the branch line 92 of dielectric resonator 34a is coupled to the strip conductor 161 which is the output of the switch 38". Likewise, by biasing the PIN diodes 133, 137, 155, and 159 in the "off" condition and the remaining PIN diodes of switch 38" in the "on" condition, a signal from the dielectric resonator 34b is coupled to the strip conductor 161. Furthermore, by biasing the PIN diodes 145, 149, 153, and 157 in the "off" condition and the remaining diodes of switch 38" in the "on" condition, a signal from the dielectric resonator 34c is coupled to the strip conductor 161. Finally, by biasing PIN diodes 143, 147, 153 and 157 in the "off" condition and PIN diodes 133, 135, 137, 139, 145, 149, 155, and 159 in the "on" condition, a signal from the dielectric resonator 34d is coupled to the strip conductor 161. With the above described arrangement, switches 32" and 38" can select dielectric resonators 34a, 34b, 34c and 34d as required.

Referring now also to FIG. 1, it should be appreciated biasing circuitry (not shown) controls the biasing of PIN diodes 103, 105, 107, 109, 113, 115, 117, 119, 123, 125, 127 and 129 of switch 32". Biasing circuitry (not shown) also controls the biasing of PIN diodes 133, 135, 137, 139, 143, 145, 147 149, 153, 155, 157 and 159 of switch 38". The frequency determining circuitry 12 provides a control signal to the biasing circuitry (not shown) to bias the PIN diodes accordingly. With such an arrangement, the microwave oscillator 10 can be selected to one of four operating frequencies.

It should now be apparent, by using a plurality of dielectric resonators and a voltage-controlled phase shifter in a feedback circuit with a noise degeneration loop, an oscillator is provided wherein improved phase noise performance and desirable frequency agility is obtained.

Having described the preferred embodiment of the invention it will now become apparent to one of skill in the art that other embodiments incorporating this concept may be used. It is felt therefore that these embodiments should not be limited to the disclosed embodiment but rather should be limited only by the spirit and scope of the appending claims.

What is claimed is:

1. An oscillator comprising:
   (a) an amplifier having an input and an output;
   (b) a feedback circuit disposed between the input and the output of the amplifier, the feedback circuit comprising:
      (i) plurality of resonators;
      (ii) a pair of switches, each switch having a first input port and multiple connectable ports, said multiple connectable ports of each switch connected to a corresponding one of the plurality of resonators; and
      (iii) a voltage-controlled phase shifter disposed in series with the switches; and
   (c) means, responsive to signals from the feedback circuit, for providing a control signal to the voltage-controlled phase shifter for degenerating low frequency noise within the oscillator.

2. The oscillator as recited in claim 1 wherein each one of the plurality of resonators is a dielectric resonator.

3. The oscillator as recited in claim 2 wherein the dielectric resonator and the pair of switches are fabricated on a common substrate.

4. The oscillator as recited in claim 3 wherein the dielectric resonator comprises:
   (a) a feedline and a branchline disposed on the common substrate;
   (b) a slot provided in the common substrate between the feedline and the branchline;
   (c) a dielectric disc having a surface; and
   (d) a dielectric standoff attached to the surface of the dielectric disc, the dielectric standoff having a portion disposed within the slot provided in the common substrate.

5. The oscillator as recited in claim 4 wherein the dielectric disc comprises a material having a dielectric constant of at least 25 providing a high Q of at least 20,000 at 10 GHz.

6. A microwave oscillator having an output signal with different selectable output frequencies comprising:
   (a) an amplifier having an input and an output;
   (b) a pair of switches, each switch having a first port and multiple connectable ports:
   (c) a plurality of resonators, each resonator resonant at a corresponding one of the different selectable output frequencies and connected between a corresponding one of the multiple connectable ports of the pair of switches, each resonator having a high Q to reduce FM noise and to provide positive feedback signals;
   (d) a voltage-controlled phase shifter having an input port, an output port and a control port, the input port being fed by one of the switches and the output port coupled to the input of the amplifier;
   (e) phase detector means, responsive to signals out of the amplifier shifted by 90° and a portion of the positive feedback signals, for providing signals representative of low frequency noise arising within the oscillator; and
   (f) means, responsive to the signals out of the phase detector means, for providing a control signal to the control port of the voltage-controlled phase shifter and for degenerating said low frequency noise.

7. The oscillator as recited in claim 6 wherein each one of the plurality of resonators is a dielectric resonator.

8. The oscillator as recited in claim 7 wherein the dielectric resonator and the pair of switches are fabricated on a common substrate.

9. The oscillator as recited in claim 8 wherein the dielectric resonator comprises:
   (a) a feedline and a branchline disposed on the common substrate;
   (b) a slot provided in the common substrate between the feedline and the branchline;
   (c) a dielectric disc having a surface; and
   (d) a dielectric standoff attached to the surface of the dielectric disc, the dielectric standoff having a portion disposed within the slot provided in the common substrate.

10. The oscillator as recited in claim 9 wherein the dielectric disc comprises a material having a dielectric constant of at least 25 providing a high Q of at least 20,000 at 10 GHz.

11. An oscillator comprising:
   (a) an amplifier having an input and an output and a field effect transistor as an active element thereof;
   (b) a pair of switches, each switch having a first port and multiple selectable ports;
   (c) a plurality of resonators disposed between the pair of switches, each resonator having a first port and a second port, the first port of the resonator connected to a corresponding one of the multiple selectable ports of one of the pair of switches and the second port of the resonator connected to a corresponding one of the multiple selectable ports of the other one of the pair of switches;

(d) a voltage-controlled phase shifter having an input, an output and a control port responsive to a control signal, to control the phase shift of signals fed thereto, the input being fed by one of the switches and the output connected to the input of the amplifier;

(e) means for dividing signals from the amplifier into at least a first path and a second path;

(f) a circulator having a first port, a second port and a third port, the first port of the circulator responsive to the signals in the first path, the second port of the circulator connected to the other one of the switches; and (g) a discriminator circuit, using a selected resonator in a reflection mode, comprising:
  (i) a phase detector having a first and second input port and an output port, the first input port responsive to signals from the third port of the circulator;
  (ii) a 90° phase shifter having an input port and an output port, the input port responsive to the signals from the second path and the output port connected to the second input port of the phase detector; and
  (iii) means, responsive to the output port of the phase detector, for providing the control signal to the voltage-controlled phase shifter.

* * * * *